(12) United States Patent
Lee

(10) Patent No.: US 6,356,130 B1
(45) Date of Patent: Mar. 12, 2002

(54) CIRCUIT FOR ENABLING SERVO SYSTEM TO PERFORM AN AUTOMATIC SYSTEM RECOVERY AND THE METHOD THEREFOR

(75) Inventor: Chun-Liang Lee, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 09/644,832

(22) Filed: Aug. 24, 2000

(51) Int. Cl.[7] .................................................. H03K 3/02
(52) U.S. Cl. ........................ 327/198; 327/142; 327/227
(58) Field of Search ................................. 327/198, 227, 327/387, 392, 535, 538, 540, 142, 143, 393

(56) References Cited

U.S. PATENT DOCUMENTS

| | | | |
|---|---|---|---|
| 4,530,056 A | * | 7/1985 | MacKinnon et al. .......... 701/25 |
| 4,951,210 A | * | 8/1990 | Fukami ....................... 701/114 |
| 5,592,073 A | * | 1/1997 | Redlich ....................... 323/300 |
| 5,600,785 A | * | 2/1997 | Potter ....................... 395/182.21 |

* cited by examiner

Primary Examiner—Terry D. Cunningham
Assistant Examiner—Paul Dinh
(74) Attorney, Agent, or Firm—Bacon & Thomas

(57) ABSTRACT

A circuit for enabling a servo to perform an automatic system recovery and a method therefor, involves the provision of a timer and associated circuit in the servo—such that the servo system can transmit a system normal signal to the timer at predetermined intervals. Once the servo system is abnormally terminated, resulting in an interruption of the transmission of the normal signal, the timer is triggered to generate a reset signal for restarting the servo so as to complete the reset process of the system.

9 Claims, 3 Drawing Sheets

CIRCUIT FOR ENABLING SERVO SYSTEM TO PERFORM AN AUTOMATIC SYSTEM RECOVERY AND THE METHOD THEREFOR

FIELD OF THE INVENTION

The present invention relates to servo systems and more particularly to a circuit for enabling servo system to perform automatic system recovery and the method therefor.

BACKGROUND OF THE INVENTION

Circuit of a conventional servo system for enabling the servo system to perform an automatic system recovery is disadvantageous for being high in design and manufacturing costs. Thus such circuit is not popular among low level and inexpensive servos. Typically, the conventional servo is restarted manually to reset the servo system when there is an abnormal termination of the servo system. This is unreliable and quite inconvenient. Thus improvement exists.

SUMMARY OF THE INVENTION

It is therefore an object of the present invention to provide a timer and associated circuit in the mainboard of servo such that servo system can transmit a signal representing system normal to the timer every predetermined period of time. Once servo system is abnormally terminated resulting in an interruption of the normal signal, the timer is triggered to generate a reset signal for restarting servo so as to complete the reset process of the system. This is an automatic system recovery process without any manual operation involved.

In one aspect of the invention, there is provided a transistor and a diode both being electrically coupled to the timer such that the signal received by the trigger pin of the timer is kept at a low level for avoiding from triggering the timer during normal servo system operation and when the connected power supply is stable.

In another aspect of the invention, there is provided a monitor circuit being electrically coupled to the timer such that a reset signal is only generated in the timer when the connected power supply is stable for preventing an erroneous reset from occurring in the servo system when the connected power supply is not stable.

In still another aspect of the invention, there is provided a register such that a high level reset signal outputted from the output pin of the timer is stored in the register for subsequent error recognition when system is abnormally terminated.

The above and other objects, features and advantages of the present invention will become apparent from the following detailed description taken with the accompanying drawings.

DETAILED DESCRIPTION OF THE PREFERRED EMBODIMENTS

Figure 1:
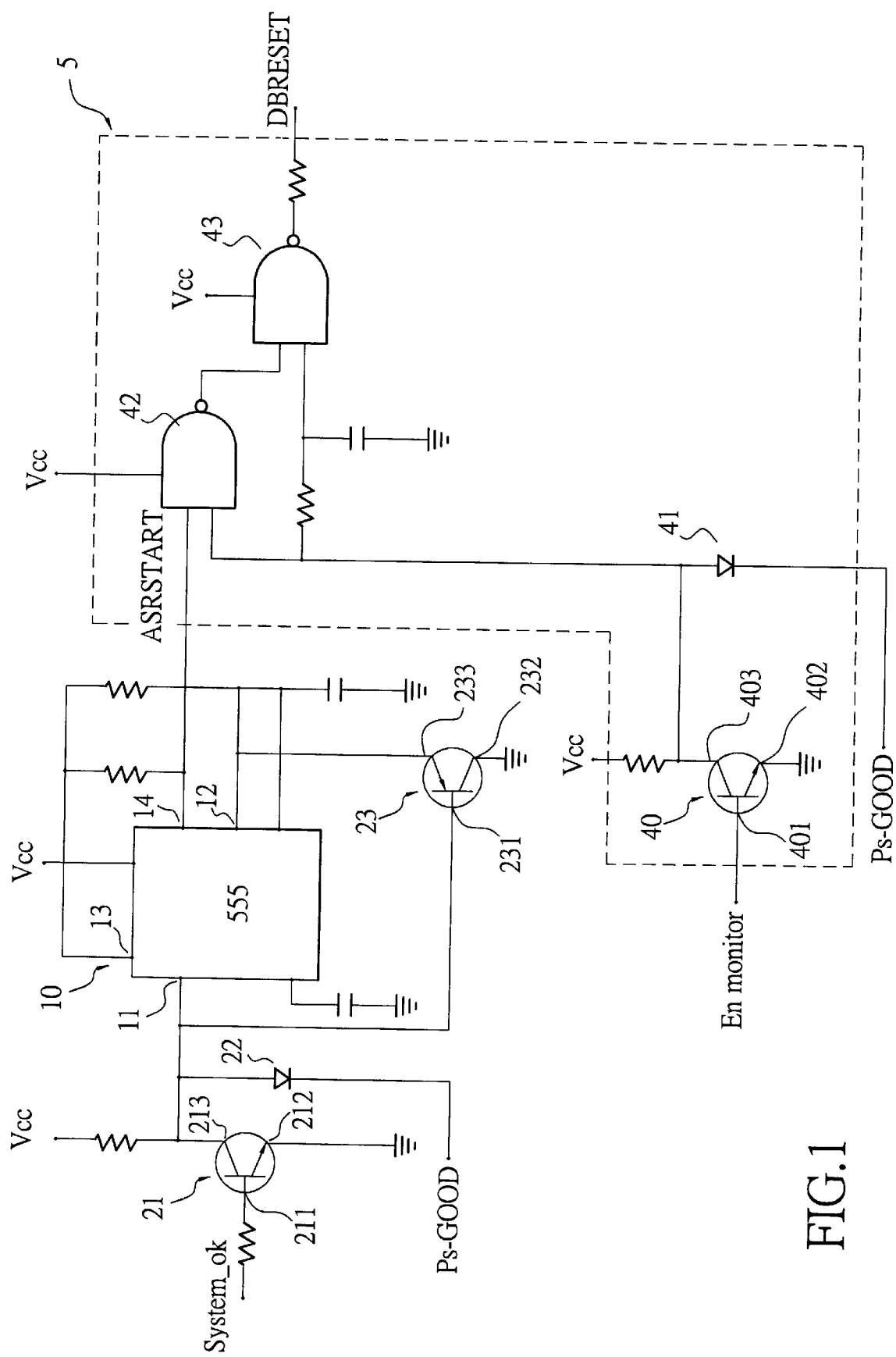
FIG. 1 is a circuit diagram of the invention for enabling servo to perform an automatic system recovery.

Referring to FIG. 1, there is shown a circuit constructed in accordance with the invention. As shown, a timer circuit is provided on servo. Timer circuit comprises a timer 10 (e.g., a multiple functional analog/digital integrated circuit with serial number 555 as shown). Trigger pin 11 is coupled to servo system for receiving a System_OK signal from servo system. The servo system can transmit a normal signal to the timer 10 every predetermined period of time. Once servo system is abnormally terminated resulting in an interruption of the normal signal, the timer 10 is triggered to generate a reset signal for restarting servo so as to complete the reset process of the system.

The servo system can transmit a high level pulse signal representing system normal to base 211 of a transistor 21 every predetermined period of time. The emitter 212 of transistor 21 is at ground, while collector 213 thereof is coupled to voltage source Vcc and trigger pin 11 of timer 10 respectively. The connection between collector 213 and trigger pin 11 is further coupled to anode of diode 22 and base 231 of monitor circuit 23 respectively. The emitter 232 of transistor 23 is at ground, while collector 233 thereof is coupled to discharge pin 12 and reset pin 13 respectively. Cathode of diode 22 is coupled to PS_GOOD (i.e., power supply is stable) end of servo system. As such, the signal received by the trigger pin 11 of the timer 10 is kept at a low level in predetermined time for avoiding from triggering the timer 10 during normal servo system operation and when the connected power supply is stable.

Once servo system is abnormally terminated resulting in an interruption of the transmission of the high level pulse signal representing system normal to base 211 of a transistor 21 every predetermined period of time, a high level pulse signal is sent to the trigger pin 11 of timer 10. As such, a low level pulse signal ASRSTART is generated in timer 10. This pulse signal ASRSTART is then sent to monitor circuit 5 through output pin 14. A low level reset signal DBRESET is generated in monitor circuit 5 after processed. This reset signal DBRESET is then sent to servo for restarting servo so as to complete the reset process of the system.

In one embodiment of the invention, monitor circuit 5 comprises a transistor 40 having a base 401 coupled to pulse signal monitor (i.e., EnMonitor) end of servo system, an emitter 402 coupled to ground and a collector 403 coupled to a 5V voltage source (Vcc), and a diode 41 having an anode coupled to collector 403 of transistor 40 and a cathode coupled to PS_GOOD (i.e., power supply is stable) end of servo system. As such, a reset signal is only generated in the timer when the connected power supply is stable for preventing an erroneous reset from occurring in the servo system due to unstable power supply. Monitor circuit 5 further comprises a NAND gate 42 having two input ends coupled to anode of diode 41 and output end 14 of timer 10 respectively and an output end, and another NAND gate 43 having two input ends coupled to anode of diode 41 and output end of NAND gate 42 respectively and an output end. As stated above, a low level pulse signal ASRSTART is outputted from output pin 14 when system is abnormally terminated. This pulse signal ASRSTART is then sent to monitor circuit 5 to process for generating a low level reset signal DBRESET at the output end of another NAND gate 43. The pulse signal DBRESET is then sent to servo for restarting it so as to complete the reset process of the system.

Figure 2:
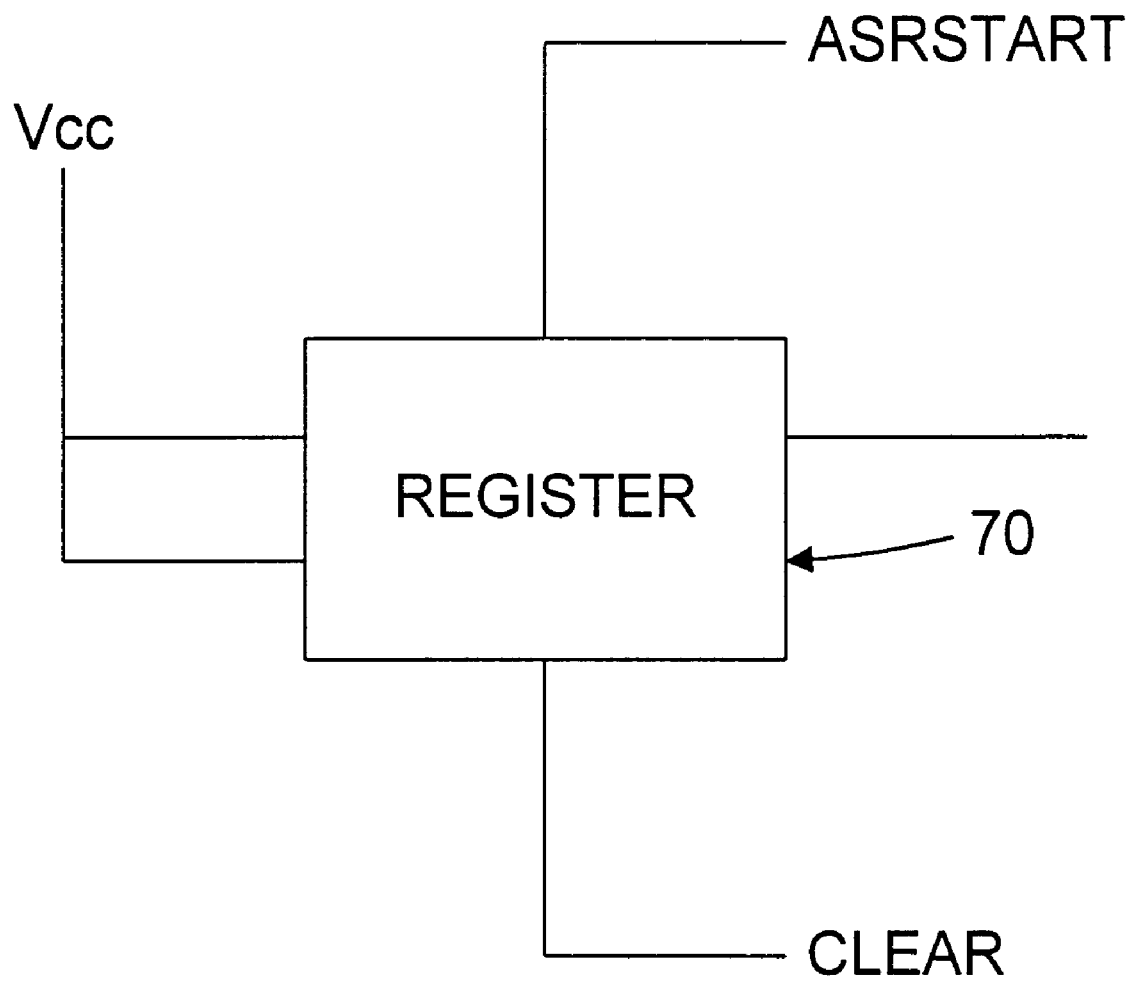
FIG. 2 schematically depicts the connection of a register according to the invention.

Referring to FIG. 2, there is shown a register 70 additionally provided by the invention. A low level status of output pin 14 is stored in register 70 when, as stated above, a low level pulse signal ASRSTART is outputted from output pin 14 of timer 10. This information is available for system or operator to recognize thereafter. The cause(s) of abnormal termination of the system may be found based on above information. Further, a clear signal CLEAR may be sent to register 70 to clear the error message therein when servo system is recovered from abnormal termination.

Figure 3:
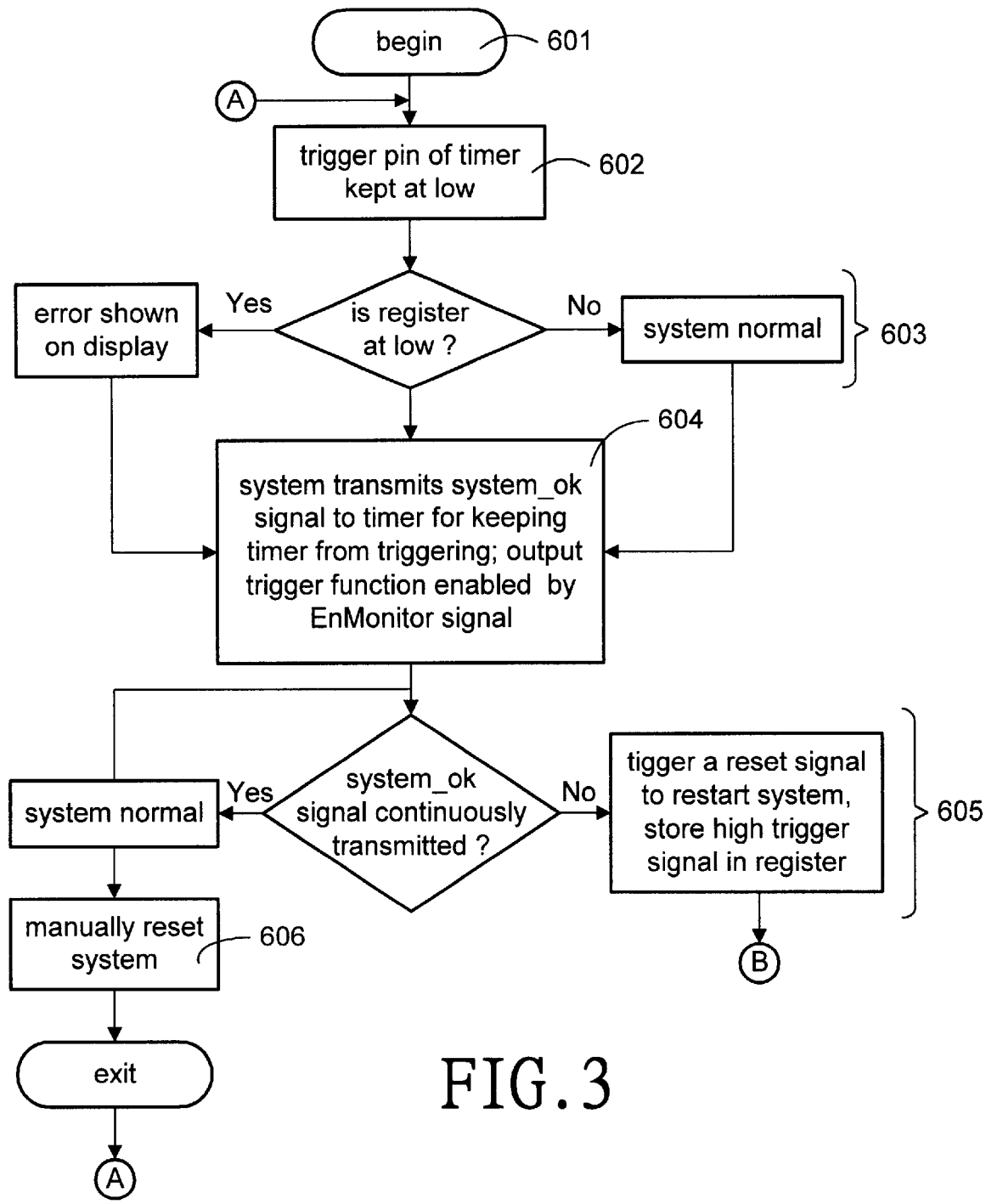
FIG. 3 is flow chart illustrating the process according to the invention.

Referring to FIG. 3, there is shown a flow chart illustrating a process for enabling servo system to perform an automatic system recovery according to the invention. This process is effected only after above circuit is provided in a conventional servo.

In step 601, servo is turned on. As stated above, cathodes of diode 22, 41 are coupled to PS_GOOD end of servo system such that the circuit of the invention will not generate an erroneous reset due to unstable power supply in the beginning. Servo system may operate normally when power supply is stable.

In step 602, trigger pin 11 of timer 10 is kept at low level by servo system.

In step 603, servo system reads error message stored in register 70 for determining whether it is in a low level. If yes, it means system normal. If not, it means system had been abnormally terminated and in response shows an error message on display for system or operator to recognize. Then, a clear signal is sent to register 70 to clear the error message when servo system is recovered from abnormal termination.

In step 604, servo system transmits a high level pulse signal representing system normal to base 211 of a transistor 21 every predetermined period of time. Then transistor 21 generates a low level signal for transmitting to the trigger pin 11 of timer 10. This in cooperation with received signal in signal monitor end EnMonitor of monitor circuit 5 will keep output DBRESET in a high level (i.e., untriggered).

In step 605, a determination is made whether system_OK signal is continuously transmitted. If no, timer 10 is triggered since servo system is abnormally terminated which in turn generates a low level reset signal through monitor circuit 5 for restarting servo. Then process loops back to step 601 to continue. If yes, it means system is normal, i.e., output pin 14 of timer 10 is kept in a high untriggered level.

In step 606, servo is reset manually by operator. Then process loops back to step 601 to continue.

The benefits of this invention includes:
1. No significant modification is required in the hardware and software of servo system. Only a timer and associated circuit are added. As a result, manufacturing cost is reduced.
2. System recovery is automatically, quickly performed when system is abnormally terminated.

While the invention herein disclosed has been described by means of specific embodiments, numerous modifications and variations could be made thereto by those skilled in the art without departing from the scope and spirit of the invention set forth in the claims.

What is claimed is:

1. A method for enabling a servo of a servo system to perform an automatic system recovery, comprising the steps of:
   a) providing a timer circuit in the servo such that the servo system transmits a system normal signal to the timer circuit at predetermined intervals of time;
   b) triggering the timer circuit when the servo system is abnormally terminated resulting in the interruption of the transmission of the normal signal so as to generate a reset signal for restarting the servo, thereby completing a reset process of the servo system; and
   c) preventing the timer circuit from being triggered to generate the reset signal upon transmission of a power supply signal from the servo system to a monitor circuit electrically coupled to an output of the timer circuit.

2. The method of claim 1, wherein the power supply signal is indicative of power system stability and wherein a trigger input of the timer is further coupled to receive the power supply signal from the system such that the reset signal is prevented from being generated in the timer circuit when the system is not powered normally.

3. The method of claim 1, further comprising a register for storing a trigger signal generated by the timer circuit to provide a record of the abnormal terminal and restart for recognition by the system or for manual recognition thereafter.

4. A circuit device for enabling a servo of a servo system to perform an automatic system recovery, comprising:
   a timer;
   a first transistor including a base coupled to the servo system for receiving a normal signal representing system normal and transmitted from the system at predetermined intervals of time, a collector at ground, and an emitter coupled to a voltage source and a trigger pin of the timer respectively;
   a diode including an anode coupled to a connection between the first transistor and the timer and a cathode coupled to a power supply signal input from the system, said power supply signal input being arranged to receive a power supply signal indicative of power supply stability; and
   a second transistor including a base coupled to a connection between the second transistor and the timer, an emitter at ground, and a collector coupled to a discharge pin and a reset pin of the timer respectively;
   wherein when the servo system is abnormally terminated resulting in the interruption of the transmission of the normal signal, the timer is triggered to generate a reset signal for restarting the servo, and wherein the level of the trigger pin of the timer is kept at a low level for preventing the timer from being triggered when the system is normal and the system is powered normally.

5. The circuit device of claim 4, further comprising a monitor circuit coupled to an output pin of the timer so as to trigger the timer to generate the reset signal for restarting the servo, thereby completing a reset process of the servo system.

6. The circuit device of claim 4, wherein the monitor circuit comprises:
   a transistor including a base coupled to a signal monitor end of the servo system, an emitter at ground, and a collector coupled to the voltage source;
   a diode including an anode coupled to the collector of the transistor and a cathode coupled to the power supply signal input from the system; and
   a first NAND gate including an output end and two input ends coupled to the anode of the diode and output pin of the timer respectively;
   wherein a reset signal is generated in the timer when the system is powered normally.

7. The circuit device of claim 6, wherein the monitor circuit further comprises a second NAND gate including an output end and two input ends coupled to the output pin of the first NAND gate and the anode of the diode, whereby the reset signal is generated in the output end of the second NAND gate when the normally powered system is terminated abnormally.

8. The circuit device of claim 4, further comprising a register coupled to an output pin of the timer for storing a trigger signal generated in the output pin of the timer to provide a record of the abnormal terminal and restart for recognition by the system or for manual recognition thereafter.

9. The circuit device of claim 8, wherein the register comprises a clear signal pin coupled to the system so as to receive a clear signal for clearing the register when the system is recovered from the abnormal termination.

* * * * *